United States Patent
Gong et al.

(10) Patent No.: US 11,322,202 B1
(45) Date of Patent: May 3, 2022

(54) SEMICONDUCTOR LOGIC CIRCUITS INCLUDING A NON-VOLATILE MEMORY CELL

(71) Applicant: International Business Machines Corporation, Armonk, NY (US)

(72) Inventors: Nanbo Gong, White Plains, NY (US); Takashi Ando, Eastchester, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/145,632

(22) Filed: Jan. 11, 2021

(51) Int. Cl.
*G11C 13/00* (2006.01)
*H01L 45/00* (2006.01)

(52) U.S. Cl.
CPC ...... *G11C 13/0069* (2013.01); *G11C 13/0004* (2013.01); *G11C 13/004* (2013.01); *H01L 45/06* (2013.01); *H01L 45/126* (2013.01); *H01L 45/1233* (2013.01); *H01L 45/143* (2013.01); *H01L 45/144* (2013.01); *H01L 45/16* (2013.01); *G11C 2013/0052* (2013.01); *G11C 2013/0092* (2013.01)

(58) Field of Classification Search
None
See application file for complete search history.

(56) References Cited

U.S. PATENT DOCUMENTS

| | | | |
|---|---|---|---|
| 5,543,737 | A | 8/1996 | Ovshinsky |
| 7,336,525 | B2 | 2/2008 | Fujita |
| 7,738,288 | B2 | 6/2010 | Kang |
| 10,586,922 | B1 | 3/2020 | Cohen |
| 10,700,274 | B2 | 6/2020 | Cohen |
| 2013/0033929 | A1 | 2/2013 | Kim |
| 2020/0013951 | A1* | 1/2020 | Wu ..................... H01L 27/2409 |

FOREIGN PATENT DOCUMENTS

CN 101552603 B 4/2011

OTHER PUBLICATIONS

Burr et al., "Recent Progress in Phase-Change Memory Technology", IEEE Journal on Emerging and Selected Topics in Circuits and Systems, vol. 6, No. 2, Jun. 2016, pp. 146-162.
Ielmini et al., "In-memory computing with resistive switching devices", Nature Electronics, 1(6), 333-343—Jun. 2018, 34 pages.
Kanan, Nadim H., "Phase Change Devices for Nonvolatile Logic", Doctoral Dissertations, University of Connecticut Graduate School, May 2, 2017, 122 pages.
"XOR Gate", From Wikipedia, the free encyclopedia, last edited on Nov. 21, 2021, 5 pps., <https://en.wikipedia.org/wiki/XOR_gate>.

* cited by examiner

*Primary Examiner* — James G Norman
(74) *Attorney, Agent, or Firm* — David K. Mattheis; Maeve M. Carpenter

(57) ABSTRACT

A phase change memory (PCM) device including a bottom electrode, a bottom heater over the bottom electrode, a bottom buffer layer over the bottom heater, a PCM region over the bottom buffer layer, a top buffer layer over the PCM region, a top heater over the top buffer layer, and a top electrode over the top heater.

20 Claims, 9 Drawing Sheets

600

SEMICONDUCTOR LOGIC CIRCUITS INCLUDING A NON-VOLATILE MEMORY CELL

BACKGROUND

The disclosure relates generally to semiconductor logic circuits. The disclosure relates particularly to exclusive or (XOR) and exclusive nor (XNOR) circuits including a single non-volatile memory cell.

Phase Change Memory (PCM) devices are non-volatile memory devices in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element.

With phase change memory, information is stored in materials that can be manipulated into different phases. Each of these phases exhibit different electrical properties which can be used for storing information. The amorphous and crystalline phases are typically two phases used for bit storage (0's and 1's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. An example of this would be $Ge_2Sb_2Te_5$ (GST-225), SbTe, and $In_2Se_3$.

Phase change memory cell designs also attempt to minimize the area of each cell in order to maximize the density of the memory cell arrays, thereby reducing the overall die footprint of the associated circuits. Reducing the number of circuit components necessary for a logic device provides a means to reduce the overall logic circuit die footprint.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatuses and/or computer program products enable computer logic circuits having fewer components and a reduced die footprint.

Aspects of the invention include a semiconductor device having a bottom electrode, a bottom heater over the bottom electrode, a bottom buffer layer over the bottom heater, a PCM region over the bottom buffer layer, a top buffer layer over the PCM region, a top heater over the top buffer layer, and a top electrode over the top heater.

Aspects of the invention disclose methods, systems and computer logic circuits associated with a semiconductor logic circuit including a non-volatile memory cell disposed in series between a first node and a second node, the first node configured to receive a first write pulse, the second node configured to receive a second write pulse, and the circuit configured to receive a read pulse across the first and second nodes. The method includes concurrently applying the first write pulse and the second write pulse to the non-volatile memory cell prior to a logical write operation, concurrently writing a first logical state of the first node and writing a second logical state of the second node, to the non-volatile memory, applying a read pulse across the first node and the second node, and interpreting the logical state of the circuit according to a response associated with the read pulse.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
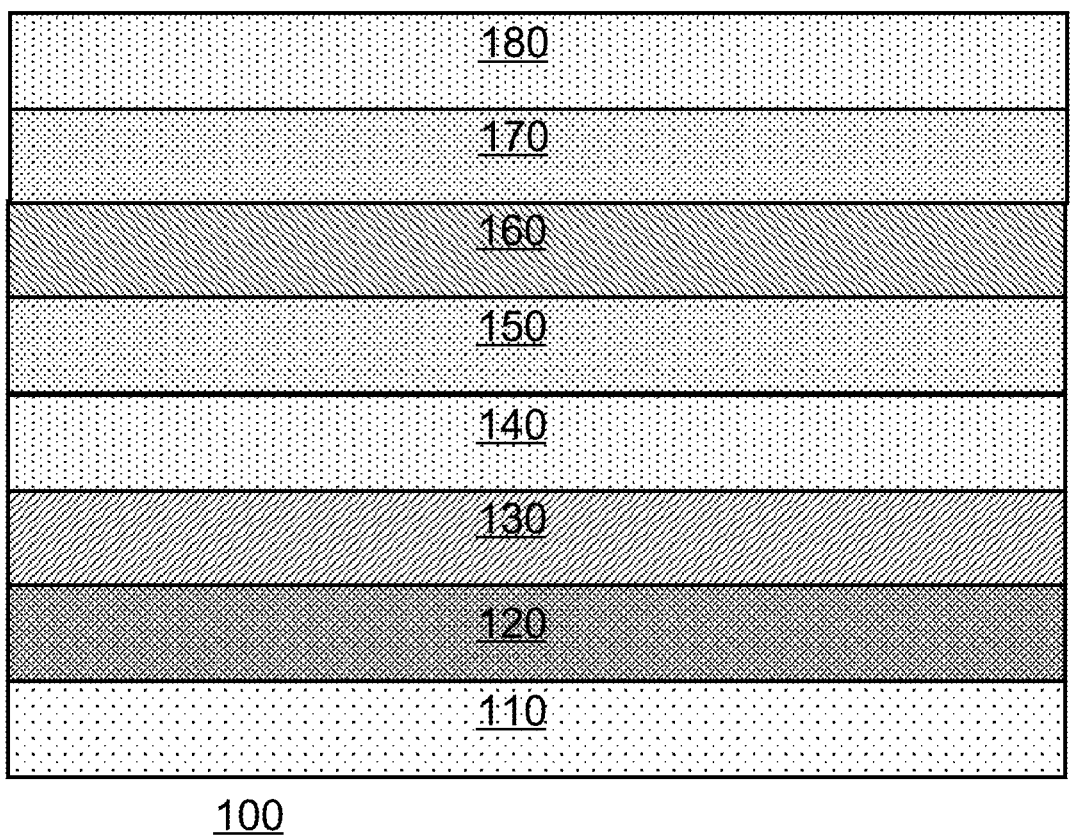
FIG. 1 provides a cross-sectional view of a semiconductor device during fabrication, according to an embodiment of the invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

PCM material takes advantage of the large resistance contrast between the amorphous and crystalline states. The amorphous phase has high electrical resistivity, and the crystalline phase has a low resistivity. Oftentimes the difference in resistivity is three to four orders of magnitude. Thus, the change in read current is very large which provides for an opportunity for multiple analog levels that are needed for multi-level cell technology operations.

From a high resistivity amorphous phase, the PCM material may be set to the low resistivity crystalline phase by the application of sufficient current to raise the temperature of the PCM material above the threshold temperature necessary to crystalize the amorphous phase. The PCM material may then be reset by the application of sufficient current to raise the temperature of the PCM material above the melt temperature of the material, melting the crystals. The molten material is then quenched by the rapid removal of the current. Quenching the PCM material results in the material returning to the amorphous glass phase.

Efforts to reduce the size of computer processors focus on the reduction of individual circuit components as well as reducing the number of circuit components required. Disclosed embodiments enable reduced die footprints for logical exclusive or (XOR) and exclusive nor (XNOR) circuits by reducing the number of necessary circuit components. Disclosed circuits include a single non-volatile phase-change memory cell for each of the XOR and XNOR variants.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

FIG. 1 illustrates a semiconductor device 100 during fabrication according to an embodiment of the invention. As shown in the Figure, device 100 includes bottom electrode 130 disposed upon a dielectric layer such as a $SiO_2$ layer 120, which, in turn, is disposed upon substrate 110. The respective layers may be formed by sputtering or chemical vapor deposition (CVD), for example, with a metal forming the bottom electrode 130, typically tungsten or titanium nitride.

The semiconductor substrate 110 may include any semiconductor material including, for example, silicon. The substrate may include circuits such are logic circuits and memory circuits that may connect to devices taught by this invention. The term "semiconductor material" is used throughout the present application to denote a material that has semiconducting properties. Besides silicon, the semiconductor material may be strained Si, SiC (silicon carbide), Ge (germanium), SiGe (silicon germanium), SiGeC (silicon-germanium-carbon), Si alloys, Ge alloys, III-V semiconductor materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

FIG. 1 further illustrates device 100 after formation of a bottom heater layer 140, exemplary bottom heater 140 materials include tantalum nitride (TaN) titanium nitride (TiN), tungsten (W), and electrically similar materials. Typically, the choice of bottom heater 140 materials is a material that does not react or mix with the top buffer layer 150 at elevated operation temperatures as explained below.

FIG. 1 further illustrates the device after the deposition of a bottom buffer layer 150, a PCM region layer 160, a top buffer layer 170, and a top heater layer 180. Exemplary top and bottom buffer layer materials include Carbon (C), TiN, TaN, TiC, TaC, TiAlN, TaAlN, TiAlC, TaAlC, HfN and WN. PCM region 160 materials include germanium telluride (GeTe), antimony telluride ($Sb_2Te_3$), gallium antimonide (GaSb), aluminum antimonide (AlSb), germanium antimony telluride ($Ge_2Sb_2Te_5$) or GST. Other compositions of $Ge(x)Sb(y)Te(z)$ can be used, where x, y and z are integers that define the chemical composition. For example, for $Ge_2Sb_2Te_5$ x=2, y=2, and z=5. Exemplary top heater 180 materials include those materials described for bottom heater 140. CMP may be performed after the deposition of each layer and prior to the deposition of the next layer.

In an embodiment, PCM region 160 has a thickness of about 100 nm. In an embodiment, PCM region has a thickness of about 20 nm. In an embodiment, PCM region 160 has a thickness of between about 20 nm and about 100 nm. PCM device switching speeds relate to PCM region thickness. For a given fixed rate of energy application to the PCM region, thicker layers require longer heating times to change phase and switch logical states. Thinner PCM region thicknesses require less overall energy and shorter time periods to change phase and logical state.

Figure 2:
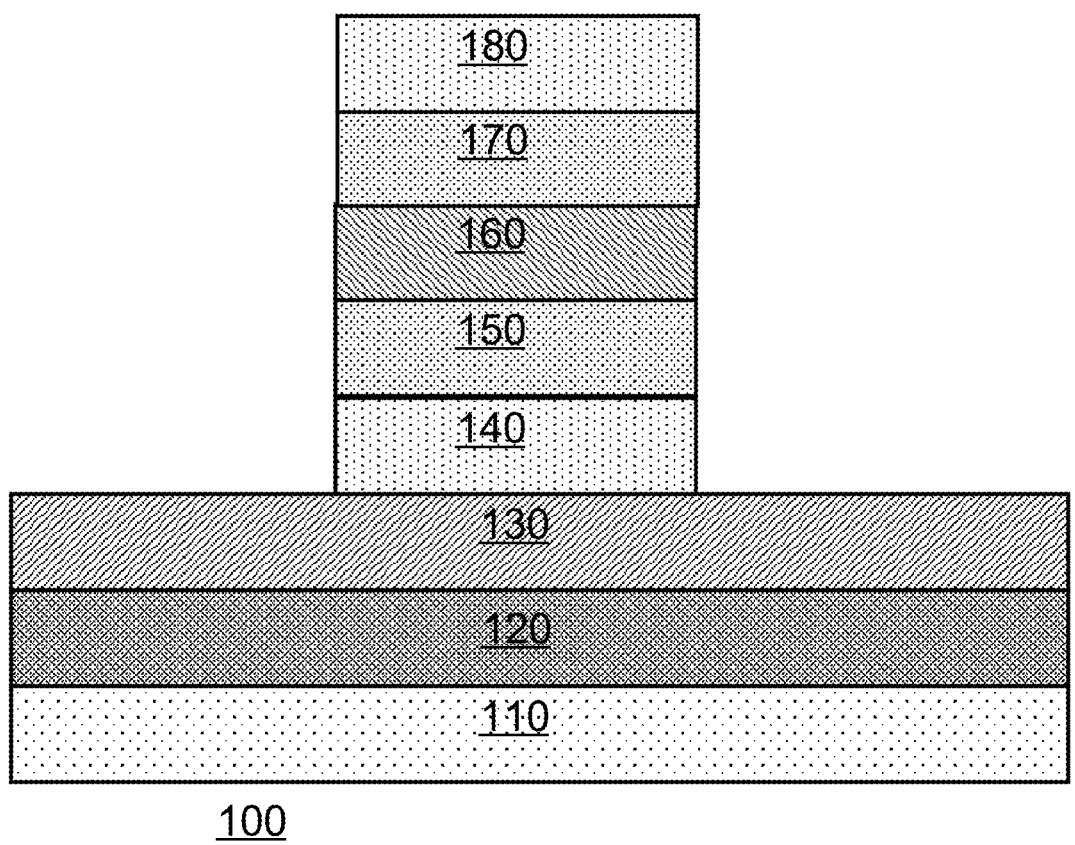
FIG. 2 provides a cross-sectional view of a semiconductor device during fabrication, according to an embodiment of the invention.
Figure 3:
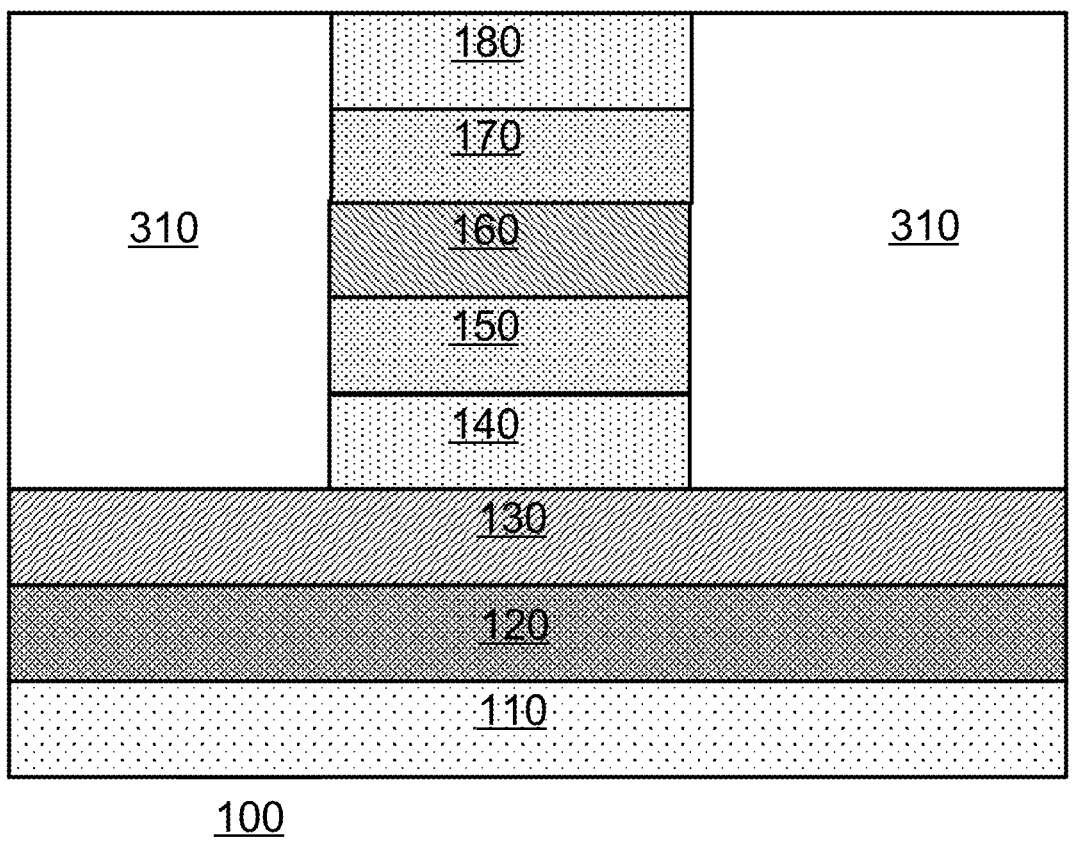
FIG. 3 provides a cross-sectional view of a semiconductor device during fabrication, according to an embodiment of the invention.

FIG. 2 illustrates the device after the formation of the PCM pillar from layers 140, 150, 160, 170, and 180, using reactive ion etching or other suitable etching methods. After formation of the PCM pillar, a layer 310 of isolation layer dielectric (ILD) material is deposited. Examples of an ILD materials are SiN and low-k dielectrics. The ILD supports, protects and passivate the PCM pillar structure as shown in FIG. 3. CMP is used to planarize the structure and expose the top heater 180.

Figure 4:
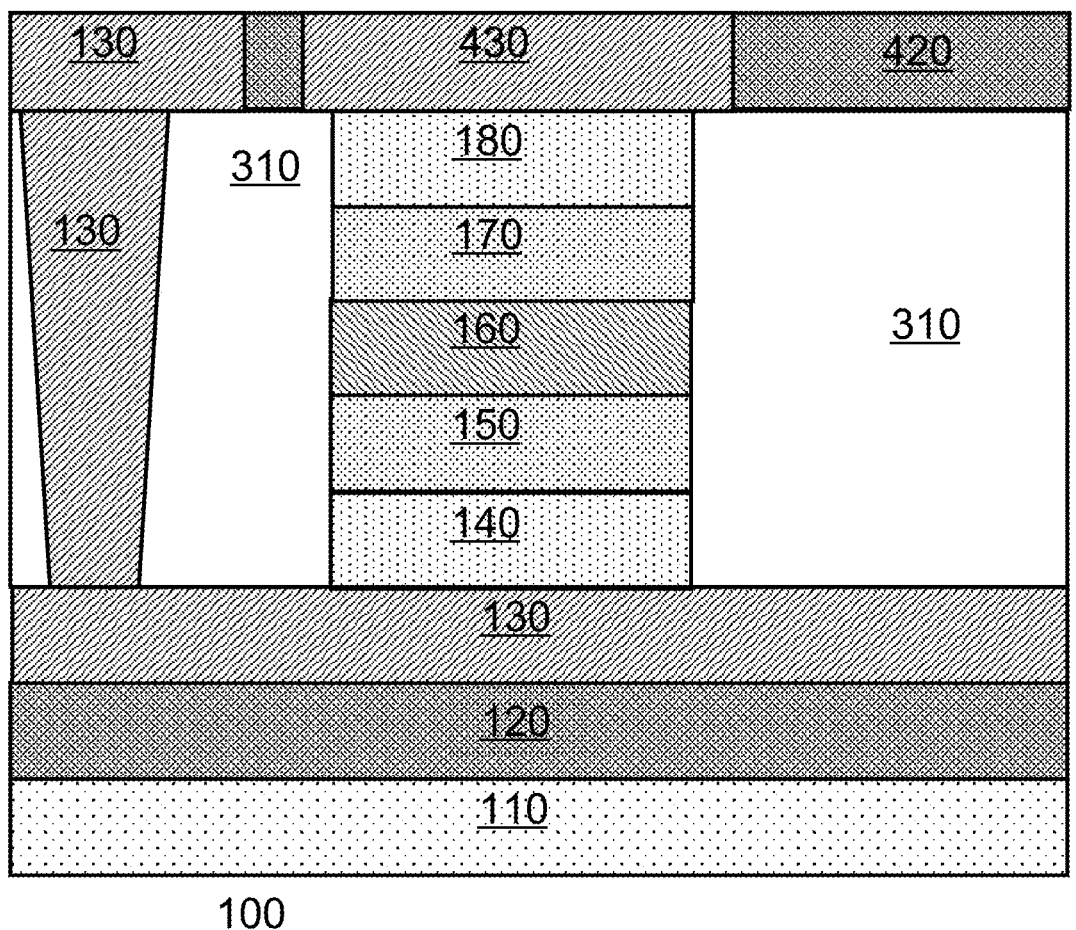
FIG. 4 provides a cross-sectional view of a semiconductor device during fabrication, according to an embodiment of the invention.

FIG. 4 illustrates the device after the addition of ILD material 420, the etching of a via for top electrode 430 and the deposition of top electrode material similar to that described for the bottom electrode 130. The Figure further shows the etching of a via for the upper portion of the bottom electrode 130 through ILD material 310 and the deposition of bottom electrode 130 material.

In an embodiment, one or more components of the system can employ hardware and/or software to solve problems that are highly technical in nature (e.g., applying concurrent write pulses to a non-volatile memory cell, reading the state of the non-volatile memory cell, interpreting the logical state of a circuit, etc.). These solutions are not abstract and cannot be performed as a set of mental acts by a human due to the processing capabilities needed to facilitate computer logic interpretation, for example. Further, some of the processes performed may be performed by a specialized computer for carrying out defined tasks related to logic circuit operations. For example, a specialized computer can be employed to carry out tasks related to computer logic or the like.

In an embodiment, disclosed logic circuits reduce the processing cycles necessary to utilize an XOR circuit. In this embodiment, the method resets the XOR circuits in a first clock cycle by concurrently applying first and second write pulses to the PCM memory cell. During a second clock cycle the method writes the logical state of each of two nodes, X1 and X2 to the XOR circuit memory cell. IN a third clock cycle the method reads the state of the XOR circuit by applying a READ voltage across the PCM memory cell.

Table 1 provides the logical truth table for an XOR circuit. As shown in the table, the XOR circuit having inputs of X1 and X2, and an output of Y, provides a logical "0" output for matching input values, both input values either logical "0" or logical "1", and provides a logical "1" output for mismatched input values, one input a logical "0" and the other a logical"1".

TABLE 1

| XOR logic truth table | | |
|---|---|---|
| X1 | X2 | Y |
| 0 | 0 | 0 |
| 0 | 1 | 1 |
| 1 | 0 | 1 |
| 1 | 1 | 0 |

Table 2 provides the logical truth table for an XNOR circuit. As shown in the table, the XNOR circuit having inputs of X1 and X2, and an output of Y, provides a logical "1" output for matching input values, both input values either logical "0" or logical "1", and provides a logical "0" output for mismatched input values, one input a logical "0" and the other a logical"1".

TABLE 2

XNOR logic truth table

| X1 | X2 | Y |
|----|----|----|
| 0  | 0  | 1 |
| 0  | 1  | 0 |
| 1  | 0  | 0 |
| 1  | 1  | 1 |

Figure 5:
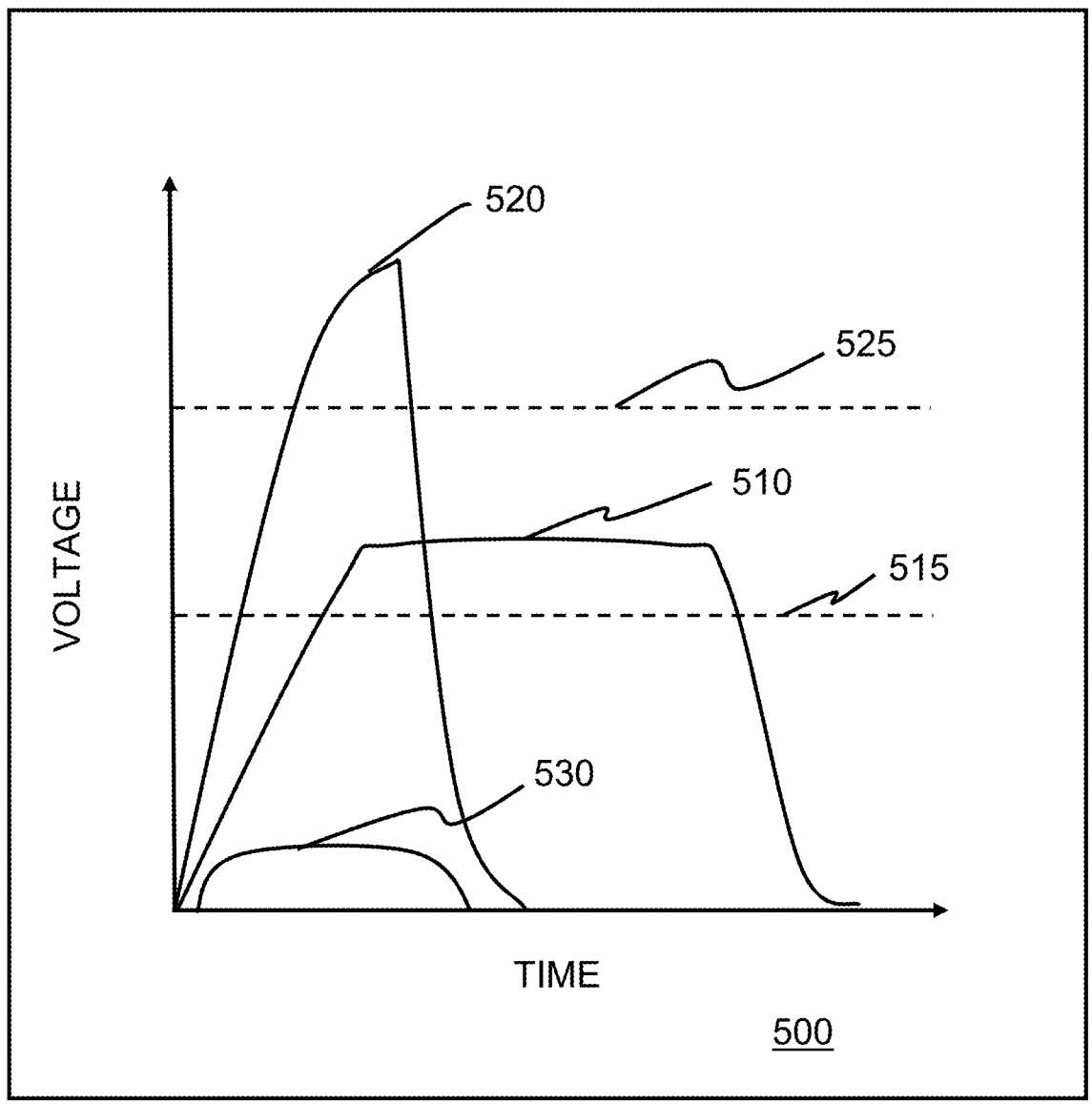
FIG. 5 provides a graphical depiction of an input voltage and a device state, according to an embodiment of the invention.

A phase-change memory (PCM) cell, such as a PCM using Chalcogenide materials, transitions between a logical "0" and a logical "1" by altering the material phase of the constituent chalcogenide material between amorphous glass, having a relatively high resistance, and a crystalline lattice having a relatively low resistance. As shown graph 800 of FIG. 5, writing, or setting the initial logical "0" state of the PCM to the logical 1 state requires the application of a voltage set pulse 510, across the PCM material sufficiently high that the associated current across the material raises the material's temperature beyond the glass-crystal transition temperature 515. Holding the material at that voltage—temperature—long enough enables the material to crystallize. Resetting the PCM from logical "1" to logical "0", requires applying a higher reset voltage pulse 520, and an associated higher current, to the material. The higher voltage/current yields a higher temperature which exceeds the material's crystal melt temperature 525 and melts the crystal. Rapid removal of this voltage yields a reset of the material from the melted state to the amorphous glass phase of the logical "0" state. Reading the logical state of the PCM requires the application of a READ voltage pulse 530 to the PCM material and measuring the resistance and/or current associated with the known READ voltage. As shown in FIG. 5, READ voltage 530 lies below the glass-crystal transition threshold 515. Reading the logical state of the PCM cell does not set or reset the PCM cell material as the electrical signal applied to the PCM cell to read the state of the PCM cell does not raise the temperature of the PCM cell enough to either crystalize or melt the PCM material.

Figure 6:
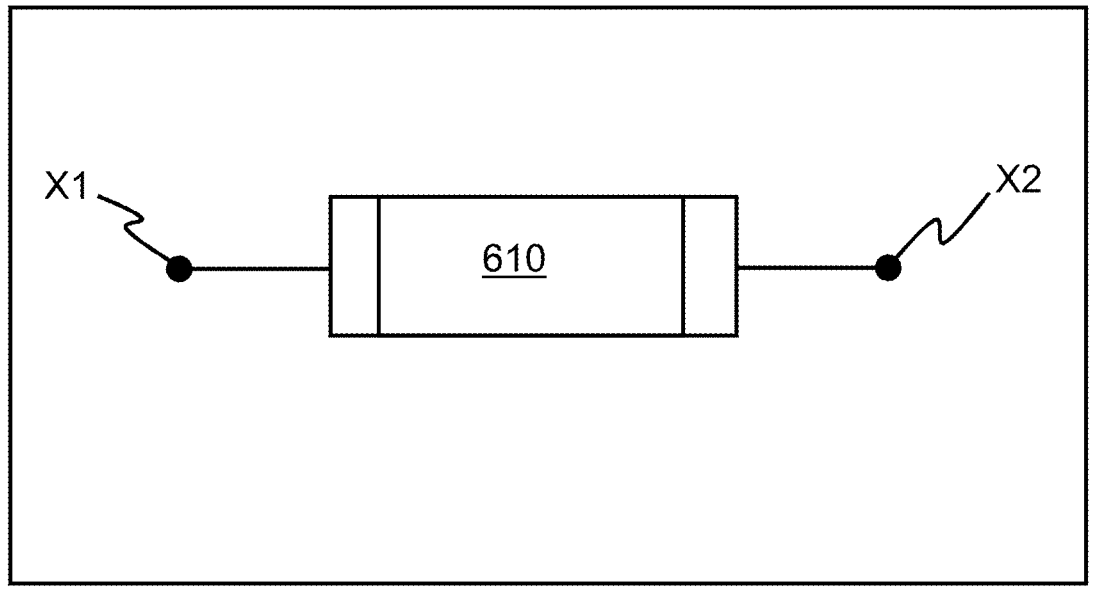
FIG. 6 provides a schematic illustration of logic circuit components, according to an embodiment of the invention.

Schematic 600 of FIG. 6 illustrates components of a semiconductor logic circuit. As shown in the Figure, the illustrated circuit portion includes a PCM cell 610 in series with a first node X1, and a second node X2. In an embodiment, first node X1 connects to a word line and one or more voltage pulse generators, as well as peripheral switching elements enabling control over the signal passing through X1 and PCM cell 610. Similarly, second node X2 connects to a bit line and at least one voltage pulse generator. The bit line further connects second node X2 to switching elements enabling control over the signal passing through X2 and PCM cell 610. In this embodiment, the voltage pulse generator connected to X1 and the voltage pulse generator connected to X2 have opposite polarities. In this embodiment, a READ circuit connects to X1 and X2, enabling the application of a low level READ voltage across the X1, PCM cell 610, X2, series of components and the measuring of the resistance of the PCM by way of the current generated using a known READ voltage.

Figure 7:
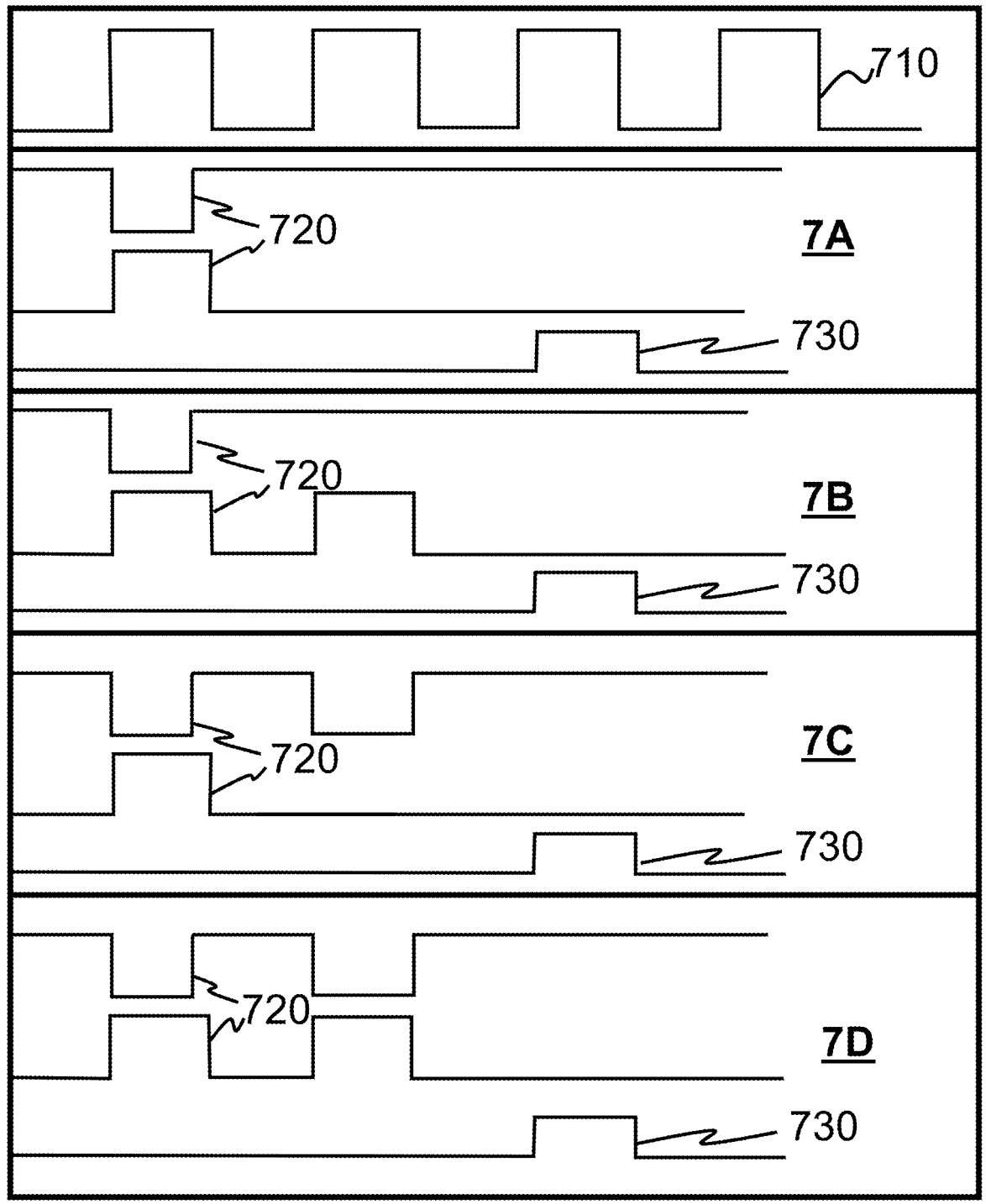
FIG. 7 provides a schematic illustration of logic circuit control write, and read signals, according to an embodiment of the invention.

FIG. 7 provides a set of timelines 700 illustrating the signals applied to an XOR gate of an embodiment of the invention relative to a series of clock pulses 710. In an embodiment, prior to every logic write and logical operand read cycle, the parent device which includes the disclosed logic circuit of FIG. 6, concurrently applies write pulses to PCM cell 610 from each of the X1 and X2 nodes. As shown in FIG. 7, during a high clock pulse, the method applies the two write pulses 720, to the PCM. The two pulses may completely or only partially overlap as they are applied across the PCM cell 610. The two pulses are from voltage pulse generators having opposite polarities and combine to a single pulse (not shown) having a voltage amplitude equal to the sum of the two individual voltage amplitudes. In this embodiment, the sum of the two write pulse voltages exceeds the PCM cell 610 material melt voltage threshold, the passage of the corresponding current raises the temperature of PCM cell 610. The elevated temperature melts the material. Rapid removal of the voltage/current quenches the material to an amorphous glass phase, resetting PCM cell 610 to the high resistance amorphous glass state. After an intervening low clock pulse, during the next high clock pulse, the method writes the logical state of each of two underlying logic registers to each of X1 and X2 respectively. As provided in the figure, scenario 7A illustrates the absence of pulses at X1 and X2 associated with logical states of X1=0, and X2=0. Scenario 7B illustrates a single X1 write pulse for X1=1, X2=0. Scenario 7C illustrates the single X2 write pulse for X1=0, X2=1. Scenario 7D illustrates concurrent X1 X2 write pulses for X1=1, X2=1. In each scenario, the method applies a READ pulse 330, to the PCM cell 610 to determine the current physical state (current and resistance levels) of the PCM cell 610 for use in interpreting the current logical state of the XOR or XNOR logic gate.

Each of the write pulses applied to PCM cell 610 from either X1 or X2 has a voltage amplitude sufficiently high as to raise the temperature of PCM cell 610 above the glass-crystal threshold of PCM cell 610, yet not sufficiently high enough to raise the temperature above the melt threshold of PCM cell 610. Each pulse by itself alters the PCM state from glass to crystal. In combination the two signals raise the PCM temperature above the melt threshold, resetting the PCM to the glass state.

Figure 8:
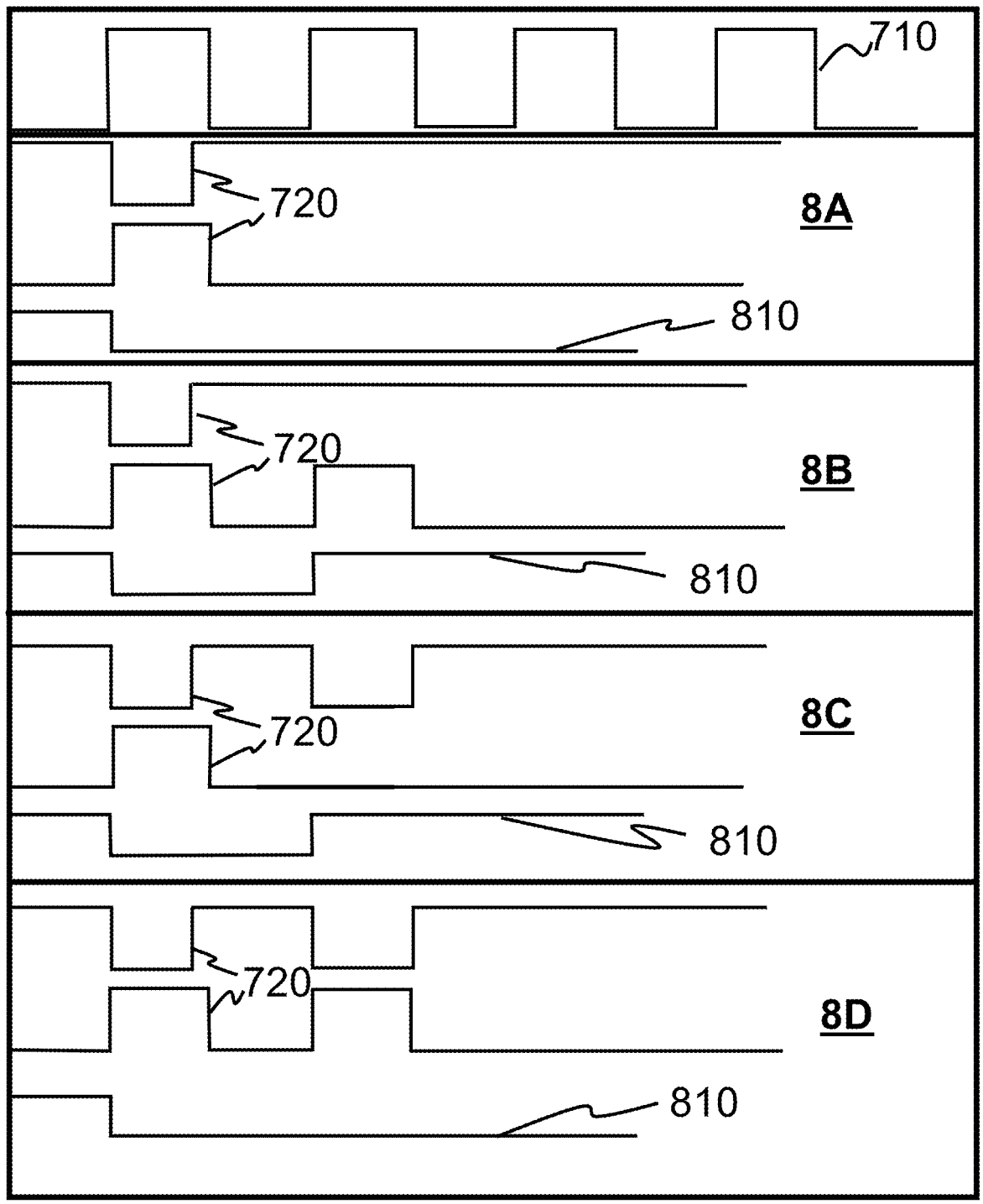
FIG. 8 provides device logical state changes for a device receiving the signals illustrated in FIG. 7, according to an embodiment of the invention.

FIG. 8 illustrates the changes to the PCM cell 610 logical state as the signals of FIG. 7 are applied. As shown in the Figure, for each scenario, the method resets the logical state 810 of the PCM from an initial logical state value of "1" to a logical value of "0". The logical state resets to "0" as the method applies the combined pre-logic operation pulses 320 to PCM cell 610 of FIG. 9. In other instances, not shown, an initial logical value of "0" will remain "0" as and after the combined write pulses are applied to the PCM material. The non-volatile PCM cell retains this state until application of a "set" pulse occurs. Regardless of the initial logical state of the circuit, after application of concurrent pulses 320, the logical state resets to "0".

For scenario 8A, corresponding to the signals of scenario 7A, no pulses are applied as each of X1 and X2 has a current logical state of "0". The PCM state remains the same and the method reads the PCM logical state high resistance, low current, or logical "0".

For scenario 8B, the method applies a single "set" voltage pulse at X1 corresponding to X1=1. The method applies no pulse at X2 as X2=0. Application of the single X1 "set" pulse alters PCM cell 610 from amorphous glass to lower resistance crystal lattice. The method then reads the PCM cell 610 logical state as low resistance, high current, or logical "1".

Similarly, for scenario 8C, the method applies a single write pulse to PCM cell 610 from node X2, as X2=1. The method applies no pulse at X1 as X1=0. Application of the single X2 "set" pulse again alters PCM cell 610 from amorphous glass to crystalline lattice, and the method again reads a current logical state of low resistance, high current, or logical "1".

In scenario 8D, the method concurrently applies write pulses from each of X1 and X2, corresponding to X1=1, X2=1. The concurrent application of the two write pulses raises the PCM cell 610 temperature above the crystal melting point and transforms the state of PCM cell 610 to high resistance amorphous state. The method reads the logical state of the PCM cell 610 as high resistance, low current, or logical "0".

In illustrated embodiments, application of the reverse polarity voltage pulse may result in a transient PCM cell 610 current in excess of the PCM melt current threshold. In this embodiment, the addition of an appropriately sized resistor in series between PCM cell 610 and node X2, or the voltage pulse generator for node X2 write pulses, enable write pulses at node X2 with less risk of excessive write pulse currents from X2 write pulses. In some embodiments, a resistor may be disposed in series between X1 and the PCM cell 610 to analogously limit the current applied to PCM cell 610 during a write pulse from X1.

In an embodiment, the method interprets the logical read results in terms of measured current. High current corresponds to a logical "1" and low current corresponds to a logical "0". For this embodiment, the logical read results correspond to an XOR gate with inputs and corresponding outputs set forth in Table 1 above. In an embodiment, the method interprets the logical read results in terms of the PCM cell 610 resistance. In this embodiment, high resistance corresponds to a logical "1" and low resistance corresponds to a logical "0". In an embodiment, the method exploits the opposing polarities of the X1 and X2 nodes and shifts the amplitude of the voltage sensor from a: 0>1 scale to a: −1>0 scale. For these embodiments, the method construes the circuit as a logical XNOR gate having inputs and outputs set forth in Table 2 above.

Figure 9:
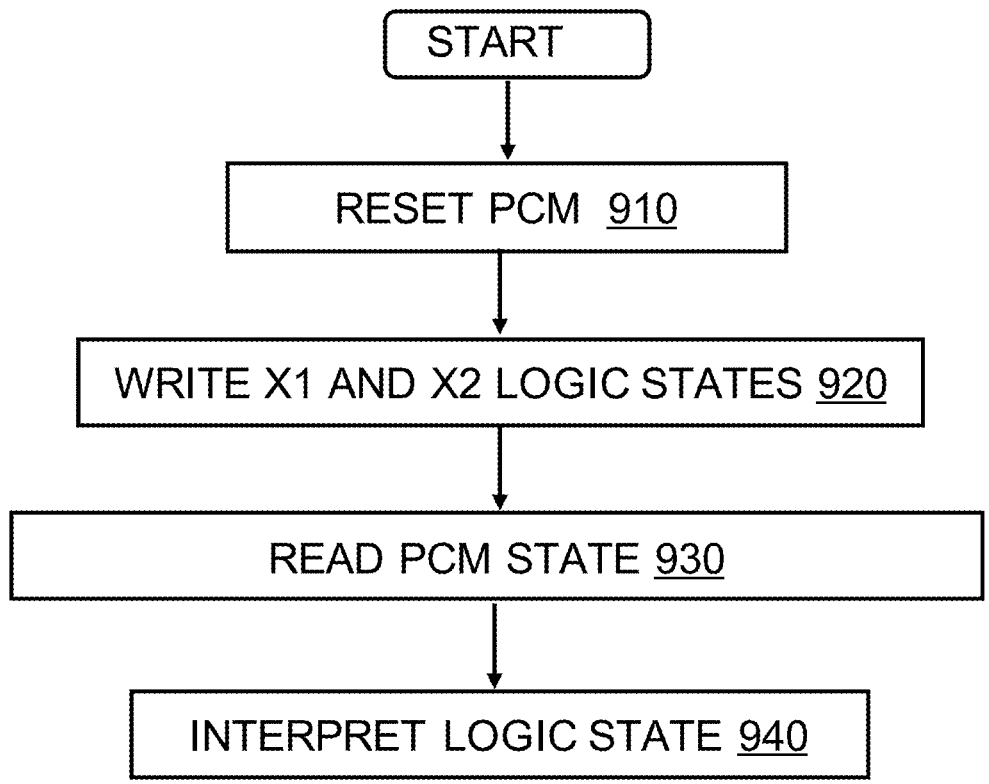
FIG. 9 provides a flowchart depicting an operational sequence, according to an embodiment of the invention.

In an embodiment, the method utilizes the opposing polarities of the X1 and X2 nodes to interpret the circuit as an XNOR rather than as an XOR circuit. In this embodiment, FIG. 9 provides a flowchart 900, illustrating exemplary activities associated with the practice of the disclosed embodiments. After program start, at block 910 the method of logic circuit control program applies concurrent write pulse from each of nodes X1 and X2 to PCM cell 610, referenced from FIG. 8 above. The two pulses overlap in the time of their application to the PCM. The pulses may be simultaneous in their application or they may simply at least partially overlap. Concurrent application of the two write voltage pulses from voltage pulse generators having opposing polarities results in a combined voltage pulse having an amplitude equal to the sum of the amplitudes of the voltages of the two underlying voltage pulses. This single write pulse has a voltage amplitude sufficiently high to exceed a melt voltage threshold of the PCM cell 610, to raise the temperature of PCM cell 610 past its melt temperature and to reset PCM cell 610 to an amorphous state having high resistance.

At block 920, the method of logic circuit control program applies write pulses to PCM cell 610 through nodes X1 and X2 according to the current logical states of registers associated with X1 and X2. Write pulses are sent for logical states of "1" and no pulses are sent for logical states of "0". Each individual write pulse has a voltage amplitude sufficiently high to transition PCM cell 610 from glass to crystal, setting the logical value of PCM cell 610 from "0" to "1", but not sufficiently high to transition the PCM material to amorphous state. In combination, the two write pulse voltage amplitudes combine and exceed the melt voltage threshold of the PCM material. The combined pulses melt the PCM and transition it to the reset, high-resistance amorphous state.

In this embodiment, for logical states of X1=0, X2=0, no pulses are applied and the PCM retains the glass state imparted by the application of two concurrent write pulses prior to the logical write. For logical states of either X1=1, X2=0, or X1=0, X2=1, a single write pulse is applied to the PCM cell 610. This single pulse has sufficient voltage amplitude to transition the PCM from the rest glass state to the set crystalline state. For the logical condition of X1=1, X2=1, two write pulses are again applied to the PCM. The PCM cell 610 transitions from the reset glass state to a melted state and then returns to the high resistance glass state.

At block 930, the method of logic circuit control program applies a low read voltage pulse across the X1, PCM cell 610, X2, series of circuit elements. The method reads the current across the elements and the associated resistance level—high current indicates low resistance and low current indicates high resistance. The read pulse voltage has an amplitude less than the set voltage threshold of the PCM material.

At block 940, the method of the logic circuit control program interprets the results of the logical read operation carried out at block 930. For XOR gate operation, the method interprets high current as a logical "1", low current as a logical "0". For XNOR operations the method interprets high current—low resistance, as a logical "0", and low current—high resistance, as a logical "0".

Disclosed circuit embodiments may be fabricated using standard complementary metal oxide semiconductor (CMOS) fabrication techniques. Phase-change memory cell structures may include mushroom cell, confined cell, pillar cell, pore cell, structures, etc.

The present invention may be a system, a method, and/or a computer program product at any possible technical detail level of integration. The invention may be beneficially practiced in any system, single or parallel, which processes an instruction stream. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, or computer readable storage device, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions collectively stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A phase change memory (PCM) device comprising:
   a bottom electrode;
   a bottom heater over the bottom electrode;
   a bottom buffer layer over the bottom heater;
   a PCM region over the bottom buffer layer;
   a top buffer layer over the PCM region;
   a top heater over the top buffer layer; and
   a top electrode over the top heater.

2. The PCM device according to claim 1, wherein the bottom buffer layer comprises a material selected from the group consisting of: C, TiN, TaN, TiC, TaC, TiAlN, TaAlN, TiAlC, TaAlC, HfN, and WN.

3. The PCM device according to claim 1 wherein the bottom heater comprises titanium nitride or tantalum nitride.

4. The PCM device according to claim 1 wherein the PCM region comprises a material selected from the group consisting of: Sb(x)Te(y), Ge(x)Sb(y)Te(z), and In(x)Se(y), wherein x, y, and z are integers.

5. The PCM device according to claim 1, wherein the PCM region comprises a thickness of less than about 100 nm.

6. The PCM device according to claim 1, wherein the PCM region comprises a thickness of less than about 20 nm.

7. The PCM device according to claim 1, wherein:
   the PCM region comprises a thickness of between about 1 and about 100 nm; and
   the PCM region comprises a material selected from the group consisting of: Sb(x)Te(y), Ge(x)Sb(y)Te(z), and In(x)Se(y), wherein x, y, and z are integers.

8. A method of fabricating a semiconductor device, the method comprising:
   forming a bottom electrode upon a substrate;
   forming a bottom heater over the bottom electrode;
   forming a bottom buffer layer over the bottom heater;
   forming a PCM region over the bottom buffer layer;
   forming a top buffer layer over the PCM region;
   forming a top heater over the top buffer layer; and
   forming a top electrode over the top heater.

9. The method according to claim 8, wherein the bottom buffer layer comprises a material selected from the group consisting of: C, TiN, TaN, TiC, TaC, TiAlN, TaAlN, TiAlC, TaAlC, HfN, and WN.

10. The method according to claim 8, wherein the buffer layer comprises germanium telluride.

11. The method according to claim 8, wherein the bottom heater comprises tantalum nitride.

12. The method according to claim 8, wherein the PCM region comprises a material selected from the group consisting of: Sb(x)Te(y), Ge(x)Sb(y)Te(z), and In(x)Se(y), wherein x, y, and z are integers.

13. The method according to claim 8, wherein the PCM region has a thickness of less than about 100 nm.

14. The method according to claim 8, wherein the PCM region has a thickness of less than about 20 nm.

15. A method for utilizing a phase change memory (PCM) semiconductor logic circuit, the circuit comprising a PCM cell disposed in series between a first node and a second node, wherein the first node is configured to receive a first write pulse, the second node is configured to receive a second write pulse, and the circuit is configured to receive a read pulse across the first node and the second node, the method comprising:
   concurrently applying the first write pulse and the second write pulse to the PCM cell prior to a logical write operation, wherein a voltage amplitude of the first write pulse and a voltage amplitude of the second write pulse combine to exceed a reset voltage amplitude of the PCM cell;
   concurrently writing a first logical state of the first node to the PCM cell and writing a second logical state of the second node to the non-volatile memory;

applying a read pulse across the first node and the second node; and interpreting a logical state of the circuit according to a current associated with the read pulse.

16. The method according to claim 15, wherein a voltage amplitude of the second write pulse exceeds a set voltage of the PCM cell and is less than a reset voltage of the PCM cell.

17. The method according to claim 15, wherein the first write pulse and the second write pulse have opposite polarities.

18. The method according to claim 15, wherein a voltage amplitude of the first write pulse exceeds a set threshold of the PCM cell and is less than a reset voltage of the PCM cell.

19. The method according to claim 15, wherein a voltage amplitude of the read pulse is less than a set threshold of the PCM cell.

20. The method according to claim 15, wherein the circuit comprises an XOR logic circuit.

* * * * *